United States Patent [19]
Yamada et al.

[11] Patent Number: 5,276,812
[45] Date of Patent: Jan. 4, 1994

[54] ADDRESS MULTIPLEXING APPARATUS

[75] Inventors: Yasuo Yamada; Akira Kanuma, both of Yokohama; Kiichiro Tamaru, Tokyo; Koichi Tanaka, Kawasaki, all of Japan

[73] Assignee: Kabushiki Kaisha Toshiba, Kawasaki, Japan

[21] Appl. No.: 759,202

[22] Filed: Sep. 11, 1991

Related U.S. Application Data

[63] Continuation of Ser. No. 546,710, Jul. 2, 1990, abandoned, which is a continuation of Ser. No. 145,044, Jan. 19, 1988, abandoned.

[30] Foreign Application Priority Data

Jan. 29, 1987 [JP] Japan .................. 62-17193

[51] Int. Cl.$^5$ .............................................. G06F 12/00
[52] U.S. Cl. ................................... 395/275; 395/425
[58] Field of Search ............................ 395/275, 425

[56] References Cited

U.S. PATENT DOCUMENTS

| | | | |
|---|---|---|---|
| 3,895,360 | 7/1975 | Cricchi et al. | 364/900 |
| 4,069,970 | 1/1978 | Buzzard et al. | 364/900 |
| 4,158,227 | 6/1979 | Baxter et al. | 364/200 |
| 4,334,287 | 6/1982 | Wiedenman et al. | 364/900 |
| 4,393,443 | 7/1983 | Lewis | 364/200 |
| 4,460,958 | 7/1984 | Christopher et al. | 364/200 |
| 4,698,749 | 10/1987 | Bhadriraju et al. | 364/200 |
| 4,744,025 | 5/1988 | Lipcon et al. | 364/200 |

OTHER PUBLICATIONS

Microsystem Component Handbook, vol. 2, Chap. 5, "8208 Dynamic RAM Controller"; 1985.

*Primary Examiner*—Robert L. Richardson
*Assistant Examiner*—C. Shin
*Attorney, Agent, or Firm*—Oblon, Spivak, McClelland, Maier & Neustadt

[57] ABSTRACT

In an address multiplexing apparatus for multiplexing address data to be supplied to 64K bit, 256K bit, and 1M bit DRAMs, upon multiplexing of address data, input address data of 20 bits are classified into two groups, i.e., the lower 16 bits and the upper 4 bits. The lower 16-bit group is multiplexed so that the upper 8 bits serve as row address data, and the remaining lower 8 bits serve as column address data. In the upper 4-bit group, adjacent bits are multiplexed. The apparatus can be commonly used for the three memories having different capacities with the simple circuit arrangement, and page mode access can be executed.

3 Claims, 4 Drawing Sheets

| OUTPUT ADDRESS | ROW ADDRESS | COLUMN ADDRESS |
|---|---|---|
| M9 | A19 | A18 |
| M8 | A17 | A16 |
| M7 | A15 | A7 |
| M6 | A14 | A6 |
| M5 | A13 | A5 |
| M4 | A12 | A4 |
| M3 | A11 | A3 |
| M2 | A10 | A2 |
| M1 | A9 | A1 |
| M0 | A8 | A0 |

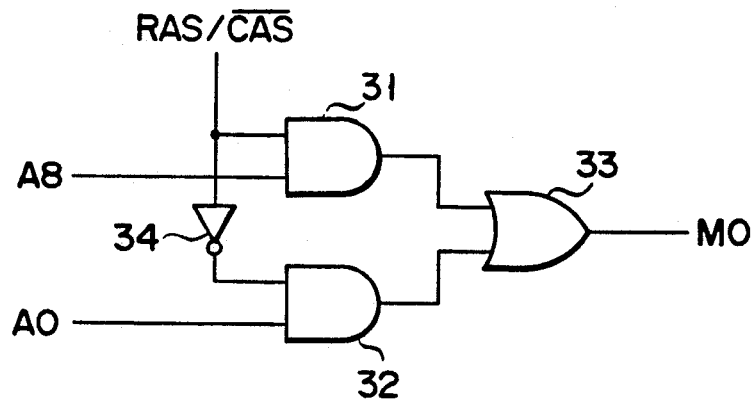
F I G. 3
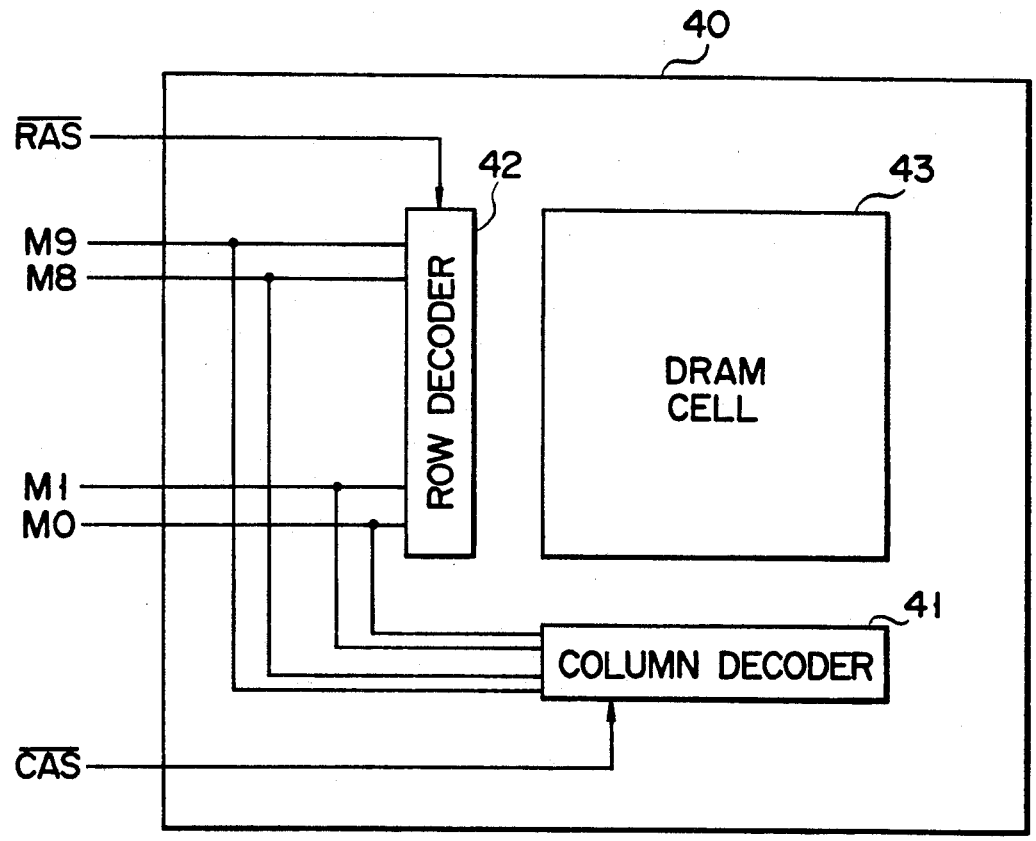
F I G. 4

| OUTPUT ADDRESS | ROW ADDRESS (1M) | COLUMN ADDRESS (1M) | ROW ADDRESS (256K) | COLUMN ADDRESS (256K) |
|---|---|---|---|---|
| M9 | A19 | A9 | — | — |
| M8 | A18 | A8 | A17 | A8 |
| M7 | A17 | A7 | A16 | A7 |
| M6 | A16 | A6 | A15 | A6 |
| M5 | A15 | A5 | A14 | A5 |
| M4 | A14 | A4 | A13 | A4 |
| M3 | A13 | A3 | A12 | A3 |
| M2 | A12 | A2 | A11 | A2 |
| M1 | A11 | A1 | A10 | A1 |
| M0 | A10 | A0 | A9 | A0 |

F I G. 5
(PRIOR ART)

| OUTPUT ADDRESS | ROW ADDRESS (1M) | COLUMN ADDRESS (1M) | ROW ADDRESS (256K) | COLUMN ADDRESS (256K) | ROW ADDRESS (64K) | COLUMN ADDRESS (64K) |
|---|---|---|---|---|---|---|
| M9 | A19 | A9 | — | — | — | — |
| M8 | A18 | A8 | A17 | A8 | — | — |
| M7 | A17 | A7 | A16 | A7 | A15 | A7 |
| M6 | A16 | A6 | A15 | A6 | A14 | A6 |
| M5 | A15 | A5 | A14 | A5 | A13 | A5 |
| M4 | A14 | A4 | A13 | A4 | A12 | A4 |
| M3 | A13 | A3 | A12 | A3 | A11 | A3 |
| M2 | A12 | A2 | A11 | A2 | A10 | A2 |
| M1 | A11 | A1 | A10 | A1 | A9 | A1 |
| M0 | A10 | A0 | A9 | A0 | A8 | A0 |

F I G. 8
(PRIOR ART)

ADDRESS MULTIPLEXING APPARATUS

This application is a continuation of application Ser. No. 07/546,710, filed on Jul. 2, 1990, now abandoned, which is a continuation of application Ser. No. 07/145,044, filed on Jan. 19, 1988, now abandoned.

BACKGROUND OF THE INVENTION

The present invention relates to an address multiplexing apparatus for multiplexing address data for accessing a memory and, more particularly, to an address multiplexing apparatus which can be commonly used for a plurality of types of memories.

A dynamic random access memory (to hereinafter be referred to as a DRAM) is a typical known memory to which multiplexed address data is supplied. A conventional address multiplexing apparatus will now be described, with reference to access control of a DRAM.

A signal in which 2n-bit address data for designating a cell to be accessed is multiplexed such that n bits serve as row address data and the remaining n bits serve as column address data is input to a DRAM. For example, in the case of a 256K bit DRAM requiring the input of 18-bit address data in order for a cell to be selected and accessed, 9 bits of the address data are input as row address data, and the other 9 bits are input as column address data. Conventionally, the 2n-bit address data is multiplexed so that the upper n bits serve as row address data and the lower n bits serve as column address data. For this purpose, the conventional address multiplexing apparatus receives nonmultiplexed address data from, for example, a processor, and a signal, supplied from a DRAM access timing generator, for designating whether a row address (RAS) or a column address (CAS) is to be selected. The apparatus multiplexes the received address data in accordance with the signal designating the row or column address, so that the upper n bits serve as the row address data and the lower n bits serve as the column address data, and outputs the multiplexed address data.

In this case, when the DRAM is continuously accessed and if addresses to be accessed have the same upper n bits, the row address need not then be input, the column address only being input. This is known as "page mode access". Using this method, the time necessary for accessing the memory can be shortened.

However, in the case of such a multiplexing method being used, it is then difficult to realize an address multiplexing apparatus which can be commonly used for a plurality of types of memories having different capacities. For example, assume that an address multiplexing apparatus is designed, which can be commonly used for a 256K bit DRAM requiring 18-bit address data, and a 1M bit DRAM requiring 20-bit address data. Then, multiplexed output address data will require 9 bits, in the case of the 256K bit DRAM, and 10 bits, in the case of 1M bit DRAM. For this reason, output lines corresponding to 10 bits must be provided, and multiplexing as shown in FIG. 5 must be performed. A multiplexing apparatus which realizes this multiplexing method receives signals respectively designating 1M row address data (RAS-1M), 256K row address data (RAS-256K), and column address data (CAS), and outputs address data multiplexed in accordance with the received signals. Since the output address has been multiplexed, a 3-to-1 selector must be used to select one bit of the input address data in accordance with each of the nine lower bits of the multiplexed output address. More specifically, when the output address has been multiplexed in the format of FIG. 5, the 3-to-1 selector selects, for example, bit $A_0$ when the column address of 1M mode or 256K mode, bit $A_9$ when the row address of 256K mode, and $A_{10}$ when the row address of 1M mode in accordance with the least significant bit $M_0$ of the multiplexed output address.

With the aim of realizing the multiplexing shown in FIG. 5, a circuit has been proposed which comprises ten 3-to-1 selectors 63 arranged between input address line 61 and output address line 62, as is shown in FIG. 6. As is shown in FIG. 7, each selector 63 comprises three AND gates 71, 72, and 73, one OR gate 74, and two inverters 75 and 76, and has a very complicated arrangement.

If this multiplexing apparatus is also to be used for a 64K bit DRAM requiring 16-bit address data, as well as for the 1M bit and 256K bit DRAMs, then the multiplexing shown in FIG. 8 must be performed and a 4-to-1 selector must be used to select one bit of the input address data in accordance with each of the eight lower bits of the multiplexed output address. In this case, the arrangement of each selector is more complex than that shown in FIG. 7. Thus, when a single address multiplexing apparatus is commonly used for a plurality of types of memories, the address multiplexing apparatus becomes increasingly complicated and larger in scale.

As may be understood from the two multiplexing apparatuses described above, any apparatus, that is designed to simply multiplex 2n-bit address data so that the apparatus can be used in addressing memories of different capacities, is inevitably very complex. If two adjacent bits are multiplexed, a 2-to-1 selector may be used, but page mode access cannot be performed.

SUMMARY OF THE INVENTION

It is an object of the present invention to provide an address multiplexing apparatus which does not require a complicated and large circuit configuration, and can perform the access control of various memories having different capacities, and which employs a page mode access method.

In order to achieve the above object, there is provided an address multiplexing apparatus for multiplexing address data for accessing a memory, comprising 2n input address lines to which pieces of input address data $A_0, A_1, A_2, \ldots, A_{2n-1}$ are supplied, $A_0$ being a least significant bit (n is a positive integer not less than two, and are classified into three groups, i.e., a first group of input address lines to which pieces of input address data $A_0, \ldots, A_{p-1}$ (p is a positive integer: $p<n$) are supplied, a second group of input address lines to which pieces of input address data $A_p, \ldots, A_{2p-1}$ are supplied, and a third group of input address lines to which pieces of input address data $A_{2p}, \ldots, A_{2n-1}$ are supplied, n output address lines from which pieces of output address data $M_0, M_1, M_2, \ldots, M_{n-1}$ are supplied, $M_0$ being a least significant bit, and are classified into two groups, i.e., a first group of output address lines from which pieces of output address data $M_0, \ldots, M_{p-1}$ are supplied, and a second group of output address lines from which pieces of output address data $M_p, \ldots, M_{n-1}$ are supplied, and a selector circuit for outputting the data supplied to said first group of input address lines to said first group of the output address lines as column address data, for outputting the data supplied to said second group of input address lines to said first group of output address lines as row address data, and for multiplexing and outputting every two data of the input data supplied to said third group of input address lines to said second group of output address lines from lower bits.

BRIEF DESCRIPTION OF THE DRAWINGS

FIG. 3 is a circuit diagram showing an internal arrangement of a selector used in the circuit shown in FIG. 2, and FIG. 4 is a block diagram showing a basic arrangement of a DRAM chip;

FIG. 5 is a view showing a combination of address bits corresponding to 256K bit and 1M bit DRAMs;

FIG. 8 is a view showing a combination of address bits corresponding to 64K bit, 256K bit, and 1M bit DRAMs.

DETAILED DESCRIPTION OF THE EMBODIMENT

Figures 1, 2:
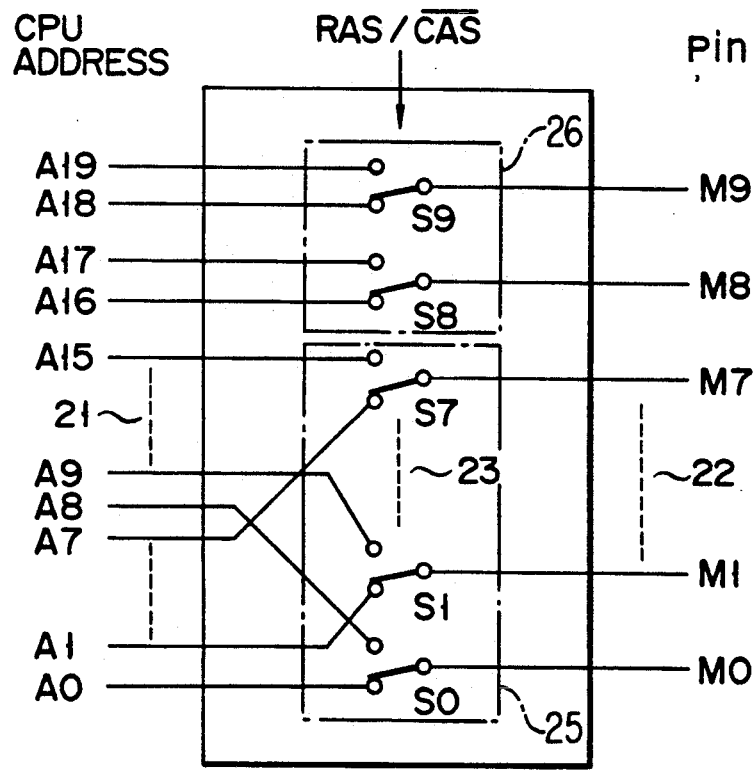
FIG. 1 is a view showing a combination of address bits which is possible during address multiplexing performed by an address multiplexing apparatus according to the present invention.
FIG. 2 is a circuit diagram showing an arrangement of the address multiplexing apparatus.
Figure 6:
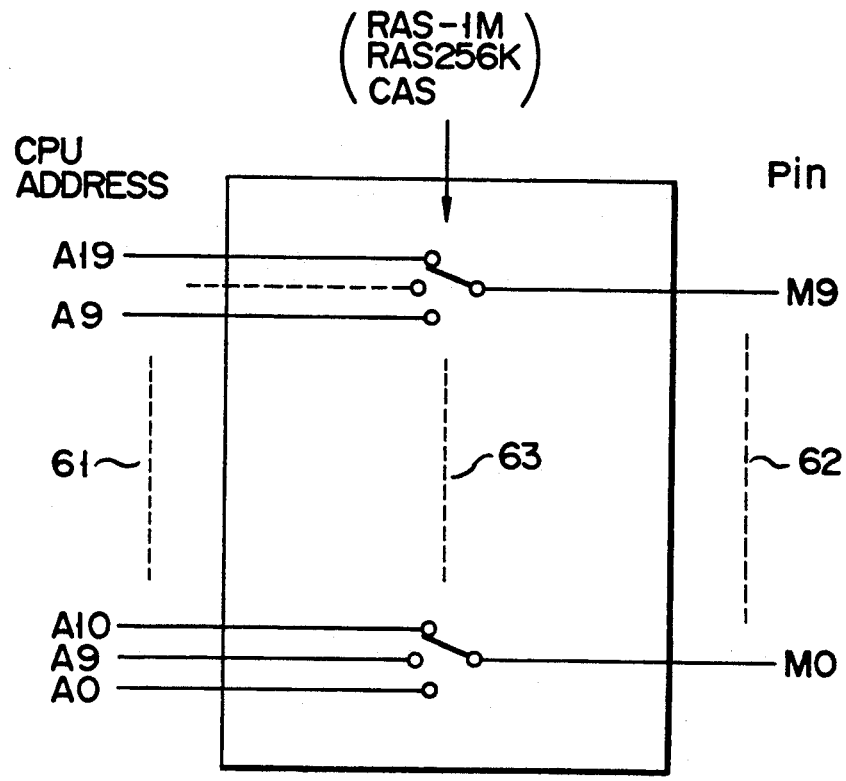
FIG. 6 is a circuit diagram showing an address multiplexing apparatus capable of realizing multiplexing of FIG. 5.

Prior to the description of an embodiment, the principle of the present invention will be described. The characteristic feature of the present invention lies in that upon multiplexing address data, input 2n-bit address data is divided to the lower 2p bits and upper (2n-2p) bits, and these two groups are subjected to different types of multiplexing.

More specifically, according to the present invention, there is provided an address multiplexing apparatus for multiplexing address data supplied to a memory.

The apparatus comprises 2n input address lines to which pieces of input address data $A_0, A_1, A_2, \ldots, A_{2n-1}$ are supplied, $A_0$ being the least significant bit (n is a positive not less than two), and n output address lines from which pieces of output address data $M_0, M_1, M_2, \ldots, M_{n-1}$ are supplied, $M_0$ being the least significant bit. Signals of two input address lines are multiplexed in the order of row and column addresses to be output onto a single output address line.

In this apparatus, input address data $A_0, A_1, \ldots, A_{2n-1}$, and output address data $M_0, M_1, M_2, \ldots, M_{n-1}$ are corresponded to each as will be described below, the input address lines are classified into three groups, i.e., a first group of input address lines to which pieces of input address data $A_0, \ldots, A_{p-1}$ (p is a positive integer: $p<n$) are supplied, a second group of input address lines to which pieces of input address data $A_p, \ldots, A_{2p-1}$ are supplied, and a third group of address lines to which pieces of input address data $A_{2p}, \ldots, A_{2n-1}$ are supplied, and the output address lines are classified into two groups, i.e., a first group of output address lines from which pieces of output address data $M_0, \ldots, M_{p-1}$ are supplied, and a second group of output address lines from which pieces of output address data $M_p, \ldots, M_{n-1}$ are supplied.

The data supplied to a first group of input address lines and the data supplied to a second group of input address lines are multiplexed to the first group of output address lines, and the data supplied to a third group of input address lines is multiplexed to the second group of output address lines. When the data supplied to the first group of input address lines and the data supplied to the second group of input address lines are multiplexed to the first group of output address lines, the data supplied to the first group of input address lines is outputted as column address data and the data supplied to the second group of input address lines is outputted as row address data.

According to the present invention, a lower 2p-bit group (i.e. a group of bits from the least significant bit $A_0$ of input address data to (2p)th bit $A_{2p-2}$ thereof and consists of the first and second input address groups) of the input address data is multiplexed such that the upper p bits (the second input address group) thereof serve as row address data, and the lower p bits (first input address group) serve as column address data. Furthermore, a group of bits from (2p+1)th bit to (2n)th bit (third group) is multiplexed such that adjacent bits, e.g., the (2p)th and (2p+1)th bits, the (2p+2)th and (2p+3)th bits, and the like, are multiplexed.

Any range of lower p bits, (p+1) bits, ..., n bits of the multiplexed output address data includes lower 2p bits, (2p+2) bits, ..., 2n bits. The p bits (from the least significant bit $M_0$ to p-th bit $M_{p-1}$) of output address data includes 2p bits (from the least significant bit $A_0$ to the 2p-th bit $A_{2p-1}$) of input address data. The (p+1) bits (from the least significant bit $M_0$ to (p+1)th bit $M_p$) of the output address data including (2P+2) bits (from the least significant bit $A_0$ to (2p+2)th bit $(A_{2p-1})$ of the input address data. The n bits (from the least significant bit $M_0$ to n-th bit $M_{n-1}$) of output address data including the 2n bits (from the least significant bit $A_0$ to the 2n-th bit $A_{2n-1}$) of the input address data. For this reason, the apparatus of the present invention can be applied to memories requiring any of 2p bits, (2p+2) bits, ..., 2n bits without any problem.

Furthermore, according to this multiplexing method, the lower p bits of the input address data are always included in the column address data of the output address data. Therefore, when the DRAM is continuously accessed, if addresses to be accessed include the same upper (2n−p) bits, row address data need not be input, and column address data need only be input. More specifically, page mode access can be performed.

As described above, according to the present invention, when address data is multiplexed, 2n-bit address data is divided into two groups, i.e., the lower 2p bits and upper (2n-2p) bits. The lower 2p bits are multiplexed such that the upper p bits serve as row address data, and the lower p bits serve as column address data. For the upper (2n-2p) bits, adjacent bits are multiplexed. Therefore, an address multiplexing apparatus which can be commonly used for a large number of types of memories having different capacities with a simple circuit configuration can be realized.

The present invention will be described in detail with reference to an illustrated embodiment.

FIG. 1 is a view showing a combination of address bits upon address multiplexing. FIG. 1 exemplifies a multiplexing method when an address multiplexing apparatus which can be commonly used for a 64K bit DRAM requiring 16-bit address data, a 256K bit DRAM requiring 18-bit address data, and a 1M bit DRAM requiring 20-bit address data is prepared. When the address multiplexing apparatus of the present invention receives only non-multiplexed address data from, e.g., a processor, and a signal supplied from a DRAM access timing signal generator and designating whether a row address (RAS) or a column address (CAS) is to be selected, it can multiplex and output row and column address data corresponding to a plurality of types of DRAMs. More specifically, 20-bit input address bits ($A_0$ to $A_{19}$) are classified into two groups, i.e., the lower 16 bits ($A_0$ to $A_{15}$) and upper 4 bits ($A_{16}$ to $A_{19}$). Furthermore, the lower 16 bits are classified into a lower group (first input address group) and an upper group (second input address group), e.g., the 0th to 7th bits ($A_0$ to $A_7$) and 8th to 15th bits ($A_8$ to $A_{15}$). The first and second input address groups are multiplexed, and are output to a first output address group ($M_0$ to $M_7$) consisting of 0th to 7th bits.

In an upper 4-bit group (third input address group), the 16th and 17th bits ($A_{16}$ and $A_{17}$) are selectively output to the 8th output address bit ($M_8$), and the 18th and 19th bits ($A_{18}$ and $A_{19}$) are selectively output to the 9th output address bit ($M_9$). More specifically, in the third input address group, adjacent bits are multiplexed and are output to the second output address group ($M_8$ and $M_9$).

As can be seen from FIG. 1, any multiplexing can be realized by a 2-to-1 selector. In addition, the lower 8 bits ($M_0$ to $M_7$) of the output address data include the lower 16 bits ($A_0$ to $A_{15}$) of the input address data, and the lower 9 bits ($M_0$ to $M_8$) of the output address data include the lower 18 bits ($A_0$ to $A_{17}$) of the input address data. For this reason, the 64K bit DRAM (accessed by the 16-bit address data) and the 256K bit DRAM (accessed by the 18-bit address data) can be respectively accessed by continuous address bits $A_0$ to $A_{15}$ and $A_0$ to $A_{17}$, respectively. Therefore, the apparatus of the present invention can be applied to these memories without any problem.

If input address data include the same upper 12 bits ($A_{19}$ to $A_8$), since the lower 8 bits ($A_0$ to $A_7$) which might or might have not been changed are all included in the column address data, page mode access can be performed by only providing column address data without providing row address data. More specifically, if input address data include the same upper 9 bits in the 256K bit DRAM and the same upper 10 bits in the 1M bit DRAM, page mode access can be executed. Therefore, in this multiplexing method, a frequency of use of page mode access is rather decreased since input address data must include the same upper 12 bits. However, in practice, page mode access can be performed with substantially no problem.

An address multiplexing apparatus for realizing the multiplexing method of this embodiment is arranged as shown in FIG. 2. More specifically, the apparatus comprises 20 input address lines 21, 10 output address lines 22, and selector circuit 23 arranged between the address lines 21 and 22. Selector circuit 23 comprises 10 2-to-1 selectors. If the selectors of selector circuit 23 are given as $S_0$ to $S_9$ in correspondence with output address bits $M_0$ to $M_9$, the input terminals of selector $S_0$ receive input address bits $A_0$ and $A_8$, the input terminals of selector $S_1$ receive bits $A_1$ and $A_9$, and the input terminals of selector $S_7$ receive bits $A_7$ and $A_{15}$. More specifically, the input terminals of selectors $S_0$ to $S_7$ respectively (which constitutes the first selector group 25) receive bits $A_i$ and $A_{i+8}$ (i=0 to 7). The input terminals of selector $S_8$ receive input address bits $A_{16}$ and $A_{17}$, and the input terminals of selector $S_9$ receive bits $A_{18}$ and $A_{19}$ (wherein selectors $S_8$ and $S_9$ constitute a second selector group 26). Note that FIG. 2 shows a state wherein selector circuit 23 selects column address data.

Figure 7:
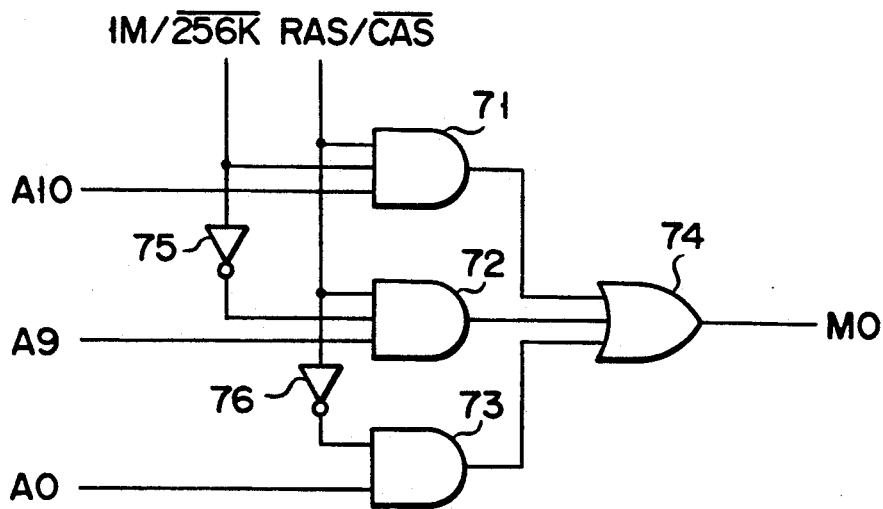
FIG. 7 is a circuit diagram showing an internal arrangement of a selector used in the circuit shown in FIG. 6.

The circuit arrangement of each selector, e.g., $S_0$, of selector circuit 23, is realized by two AND gates 31 and 32, one OR gate 33, and one inverter 34, as shown in FIG. 3. As can be seen from a comparison between FIGS. 3 and 7, in this embodiment, the arrangement of the selector can be greatly simplified. Since all selectors $S_0$ to $S_9$ are simplified as in selector $S_0$, the entire arrangement can also be greatly simplified.

Note that a multiplexed signal (corresponding to output address bits $M_0$ to $M_9$) is supplied to row or column decoder 41 or 42 of DRAM chip 40, as shown in FIG. 4. Decoder 41 or 42 is selected in accordance with data RAS/CAS, and a predetermined address of DRAM cell 43 is selected.

According to this embodiment, the address multiplexing apparatus which can be commonly used for three types of DRAMs having different capacities, i.e., 64K bit, 256K bit, and 1M bit DRAMs can be realized. In this case, although a possible range of page mode access is slightly limited, all the above DRAMs can be page-mode accessed. Furthermore, since a 2-to-1 selector can be adopted, the circuit arrangement can be greatly simplified.

The present invention is not limited to the above embodiment. For example, the combination of address bits upon multiplexing shown in FIG. 1 is an example, and if following conditions (1) to (4) are satisfied, the same effect as described above can be provided:

(1) The 0th to 7th bits of input address data appear in the lower 8 bits of column address data;

(2) The 8th to 15th bits of the input address data appear in the lower 8 bits of row address data;

(3) The 16th and 17th bits of the input address data are multiplexed at the 8th bit of the output address data; and (4) The 18th and 19th bits of the input address data are multiplexed at the 9th bit of the output address data.

As a typical memory which is accessed by multiplexed address data, DRAMs have been exemplified. If the method of the present invention is applied to other memories (ROM, SRAM, and the like), the same effect as described above can be provided. Furthermore, grouping of input and output address data (values of n and p) may be appropriately changed depending on the types of memories to be used. Various other changes and modifications may be made within the spirit and scope of the invention.

What is claimed is:

1. An address multiplexing apparatus for multiplexing address data for accessing a memory, in which 2n input address data $A_0, A_1, A_2 \ldots, A_{P-1}, A_P \ldots A_{2P-1}, A_{2P} \ldots A_{2N-1}$, which are sequentially arranged, the input address data $A_0$ being a least significant bit, are divided into three address data groups including a first address data group having the address data $A_0, A_1, A_2, \ldots, A_{P-1}$, a second address data group having the address data $A_P \ldots A_{2P-1}$, and a third address data group having the address data $A_{2p} \ldots A_{2n-1}$, wherein n is an integer not less than 3, p is a positive integer not less than 2 but less than n, and wherein said 2n input address data are multiplexed to n output address data $M_0, M_1, M_2, \ldots, M_{n-1}$, the output address data $M_0$ being a least significant bit, each output address data including one row address data and one column address data wherein one row address data and one column address data are combined with each other while being shifted in time from each other, and which comprises:

a first selector group including P, 2-to-1 selectors, each of which selectively connects two address lines corresponding to one of said input address data of the first address data group and one of said input address data of the second data group, respectively to one address line corresponding to one of said output address data, said first selector group being for multiplexing the first address data group of the input address data from the least significant bit $A_0$ to the p-th input address data $A_{p-1}$ and the second address data group of the input address data from the (p+1)th input address data $A_p$ to the $2_p$th input address data $A_{2p-1}$, to form a first output address data group of said output address data from the least significant bit $M_0$ to p-th output address data $M_{p-1}$ so that the first and second input address data groups are multiplexed on a bit-by-bit basis, each of the bits of the first input address data group forming column address data and each of the bits of the second input address data group forming row address data; and a second selector group comprising at least one 2-to-1 selector which selectively connects two address lines corresponding to successive two of said input address data of said third input address data group to one address line corresponding to one of said output address data, said second selector group being for multiplexing, on a bit-by-bit basis, the successive two of the input address data of the third input address group from the $(2_p+1)$th input address data $A_{2p}$ to the 2n-th input address data $A_{2n-1}$ being a most significant bit, to form a second output address data group of the output address data from the p-th output address data $M_p$ to the (Mn)th output address data $M_{n-1}$ being a most significant bit the successive two of said third input address data forming column and row address data, respectively, and a selective combination of said first and second output address data groups constitute an extended output address data.

2. An apparatus according to claim 1, wherein said memory includes 64K bit, 256K bit and 1M bit memories, and the values n and p are set to be n=10 and p=8, respectively.

3. An address multiplexing apparatus for multiplexing address data for accessing a memory, in which 2n input address data $A_0, A_1, A_2, \ldots, A_{19}$ which are sequentially arranged, with the first input address data $A_0$ being a least significant bit, are divided into three address data groups including a first address data group having the address data $A_0, A_1, A_2, \ldots, A_7$, a second address data group having the address data $A_8 \ldots A_{15}$, and a third address data group having the address data $A_{16} \ldots A_{19}$, and are multiplexed to 10 output address data $M_0, M_1, M_2, \ldots M$, the output address data $M_0$ being a least significant bit, each output address data including one row address data and one column address data wherein one row address data and one column data are combined while being shifted in time from each other, and which comprises:

a first selector group including eight 2-to-1 selectors, each of which selectively connects two address lines corresponding to one of said input address data of said first input address data group and one of said input address data of said second input address data group to one address line corresponding to one of said output address data, said first selector group being for multiplexing said first input address data group from said least significant bit $A_0$ to the eight input address data $A_7$ and said second input address data group from the ninth input address data $A_8$ to the sixteenth input address data $A_{15}$ to form a first output address data group from the least significant bit $M_0$ to the eighth output address data $M_7$ so that one bit of the first output address data group and one bit of the second output address data group are multiplexed together and each of the bits of the first input address data group forms column address data and each of the bits of the second input address data group forms row address data; and a second selector group including two 2-to-1 selectors, each of which selectively connects two address lines corresponding to the successive two of said input address data of said third input address data group to one address line corresponding to one of said output address data, said second selector group being for multiplexing the third input address data group from the seventeenth input address data $A_{16}$ to the twentieth input address data $A_{19}$, to form a second output address data group from the ninth output address data $M_8$ and the most significant bit $M_9$, in such a manner that two bits of the third input address data group ($A_{16}$ and $A_{17}$, $A_{18}$ and $A_{19}$) and data ($M_8$, $M_9$) of the second output address data group are multiplexed together, respectively.

* * * * *